(12) United States Patent
Yawata et al.

(10) Patent No.: US 9,005,884 B2
(45) Date of Patent: Apr. 14, 2015

(54) DEVELOPER COMPOSITION FOR PRINTING PLATE, DEVELOPER AND METHOD FOR MANUFACTURING PRINTING PLATE

(75) Inventors: Yukimi Yawata, Okayama (JP); Daiki Yoshioka, Okayama (JP)

(73) Assignee: Toyobo Co., Ltd., Osaka-shi (JP)

( * ) Notice: Subject to any disclaimer, the term of this patent is extended or adjusted under 35 U.S.C. 154(b) by 0 days.

(21) Appl. No.: 13/980,075

(22) PCT Filed: Dec. 26, 2011

(86) PCT No.: PCT/JP2011/080006
§ 371 (c)(1), (2), (4) Date: Jul. 17, 2013

(87) PCT Pub. No.: WO2012/111238
PCT Pub. Date: Aug. 23, 2012

(65) Prior Publication Data
US 2013/0288185 A1    Oct. 31, 2013

(30) Foreign Application Priority Data

Feb. 16, 2011 (JP) ................................. 2011-030714
Feb. 25, 2011 (JP) ................................. 2011-039600

(51) Int. Cl.
*G03C 5/18* (2006.01)
*G03C 5/26* (2006.01)
*G03F 7/32* (2006.01)

(52) U.S. Cl.
CPC . *G03F 7/32* (2013.01); *G03F 7/322* (2013.01)

(58) Field of Classification Search
CPC ............ G03F 7/32; G03F 7/322; G03F 7/325
USPC .............. 430/270.1, 302, 306, 399, 413, 464; 101/450.1, 453, 463.1
See application file for complete search history.

(56) References Cited

U.S. PATENT DOCUMENTS

| | | | | |
|---|---|---|---|---|
| 4,294,905 A | * | 10/1981 | Okishi et al. | 430/175 |
| 4,424,297 A | * | 1/1984 | Bey | 524/714 |
| 5,155,011 A | * | 10/1992 | Zertani et al. | 430/331 |
| 5,155,012 A | * | 10/1992 | Joerg et al. | 430/331 |
| 6,316,171 B1 | * | 11/2001 | Sekiya et al. | 430/331 |
| 2003/0022104 A1 | * | 1/2003 | Takano et al. | 430/270.1 |
| 2006/0160025 A1 | * | 7/2006 | Lungu | 430/300 |
| 2011/0039211 A1 | * | 2/2011 | Hannum et al. | 430/306 |

FOREIGN PATENT DOCUMENTS

| | | | |
|---|---|---|---|
| JP | 03-198058 A | | 8/1991 |
| JP | 10-301298 A | | 11/1998 |
| JP | 2004-170928 A | | 6/2004 |
| JP | 2009-251582 A | | 10/2009 |
| JP | 2010-237583 A | | 10/2010 |
| JP | 2010237583 A | * | 10/2010 |
| WO | 2004/090638 A1 | | 10/2004 |

OTHER PUBLICATIONS

Translation of the International Preliminary Report on Patentability (PCT/IB/338) (1 page), (PCT/IB/373) (1 page) of International Application No. PCT/JP2011/080006 mailed Aug. 29, 2013 (Form PCT/ISA/237) (3 pages).
International Search Report dated Feb. 28, 2012, issued in corresponding application No. PCT/JP2011/0800006.

* cited by examiner

*Primary Examiner* — Chanceity Robinson
(74) *Attorney, Agent, or Firm* — Westerman, Hattori, Daniels & Adrian, LLP

(57) ABSTRACT

A developer composition for a printing plate containing (a) alkali metal salt of saturated fatty acid having carbon number of 12 to 18 and (b) alkali metal salt of unsaturated fatty acid having carbon number of 12 to 18 in a weight ratio of from 20:80 to 80:20 in terms of (a):(b). The developer composition may further contain an alkali agent (c). In this case, a weight ratio of (a):(b) may be from 20:80 to 80:20, and the alkali agent (c) may be contained in amount of 0.01 to 10 part(s) by weight to 100 parts by weight in total of the components (a) and (b).

9 Claims, No Drawings

DEVELOPER COMPOSITION FOR PRINTING PLATE, DEVELOPER AND METHOD FOR MANUFACTURING PRINTING PLATE

TECHNICAL FIELD OF THE INVENTION

The present invention relates to a developer for a printing plate used in plate-making of the printing plate made of photosensitive resin. More particularly, it relates to a water-based developer suitable for developing a CTP printing original plate containing carbon black in its infrared-sensitive layer or for developing a flexographic printing original plate of a negative system.

BACKGROUND ART

It has been commonly carried out to use a photosensitive resin composition as a printing plate and that has been a mainstream in various fields of letter press, lithography, relief printing gravure and flexographic printings. As to the photosensitive resin composition, that which is developable by an aqueous type solution has been strongly demanded in view of affection to the environment and of workability. As to the flexographic photosensitive resin composition developable by water, that comprising synthetic rubber and hydrophilic polymer has been put into the market. Moreover, in recent years, there has been developed a water-developable plate where resolution is further enhanced by the use of latex which is present in fine particles as a main component.

For preparing those printing plates, a method where the film of original picture is closely adhered to a photosensitive resin printing plate in vacuo and then active ray is irradiated through the original picture film (negative system) has been widely used. In the negative system, crosslinking reaction selectively proceeds in the exposed area to which the active ray is irradiated whereupon an image part is formed. After that, the non-crosslinked resin composition in the non-exposed area is removed by washing with a water-based developer to give an uneven relief.

Since such a printing plate material requires an original picture film, manufacturing time and cost necessary therefor are needed. In addition, chemical treatment is necessary for developing the original picture film and treatment of the waste developer is further necessary whereby disadvantages in terms of environmental hygiene is accompanied therewith.

As a result of progress in computers in recent years, there has been proposed a method (Computer to Plate, CTP system) where the information treated on a computer is directly outputted onto the photosensitive resin printing plate whereby a printing plate is obtained without the step for preparing the original picture film. In the CTP system, an infrared-sensitive layer which is non-transparent to the active ray is formed on the printing plate and, when said infrared-sensitive layer is evaporated by infrared ray laser, an image mask is formed. After that, the active ray is irradiated the same as in the negative system to form an image part and the non-exposed area is removed by washing with a water-based developer to give an uneven relief. Advantages in this system are that the above-mentioned manufacturing step for the original picture film is not necessary, that a treatment of the waste developer for the original picture film is not necessary whereby it is favorable in terms of environmental hygiene and moreover that a relief in a sharp structure is prepared.

In developing the photosensitive resin printing plate in the CTP system, the non-image area protected from light by an image mask during the active ray irradiation is removed by washing with a water-based developer. At that time, the image mask layer and the non-crosslinked resin composition are dissolved or dispersed in the developer. Now, when developing is repeated using the same water-based developer, there happen problems such as that the non-crosslinked composition (scum) dispersed in the developer sticks to a brush whereby the developing property lowers and that it sticks to the printing plate surface again whereby the quality of the plate surface is deteriorated. Similar problem is also present in a printing plate of a negative system. In view of the above, similar water-based developer to the negative system has been commonly used for preventing the problem caused by the non-crosslinked resin composition (scum). In the negative system, it has been said to be suitable to use water of pH 5.0 to 9.0 including the common household water or that in which an alkaline compound such as sodium hydroxide or sodium carbonate, a surfactant or a water-soluble organic solvent is made to contain. As to the surfactant, it has been said that sodium alkylnaphthalene sulfonate, sodium alkylbenzene sulfonate, etc. may be used (cf. Patent Document 1). Further, there has been known a water-based developer where water is compounded with an anionic surfactant and, upon necessity, with a pH adjusting agent, a washing promoter, etc. As to the specific examples of the anionic surfactant, there have been known a linear alkylbenzene sulfonate having an alkyl of average carbon number of 8 to 16, an α-olefinsulfonate having average carbon number of 10 to 20 and a saturated or unsaturated fatty acid salt having average carbon number of 10 to 22 (cf. Patent Document 2).

However, although the conventionally known water-based developers are effective to the disadvantage caused by the non-crosslinked resin composition (scum), the effect thereof to the image mask layer which is developed and removed together with the non-crosslinked composition is still insufficient. The image mask layer used in the CTP system contains much water-insoluble pigment such as carbon black having an infrared ray-absorbing ability. Accordingly, the image mask layer which is washed and removed in the developing step has poor water solubility and water dispersibility and there are problems such as that small pieces of the image mask layer stick to a brush whereby the developing property lowers and that they stick to the printing plate surface again whereby the quality of the plate surface is deteriorated.

In addition, although the conventionally known water-based developers are effective during the initial developing stage where the ratio by weight of the scum dissolved or dispersed in the developer to the developer is in low concentration, there happen the problems such as that the scum sticks to a brush whereby the developing property lowers and that it sticks to the printing plate surface again whereby the quality of the plate surface is deteriorated when the scum concentration rises to an extent of 10 parts by weight or higher as a result of developing in large quantities. Therefore, a developer where the scum concentration rises is to be discarded and the plate-making is to be started again using a fresh developer. However, it is not preferred in view of the load to the environment and also of the manufacturing cost that the discarding of the used developer and the supplementing of a new developer are frequently repeated.

PRIOR ART DOCUMENTS

Patent Documents

Patent Document 1: Japanese Patent Application Laid-Open (JP-A) No. 198058/91
Patent Document 2: WO 2004/090638

DISCLOSURE OF THE INVENTION

Problem that the Invention is to Solve

The present invention has been created based on the current status of the prior art as such and its object is to provide a water-based developer where the dispersibility of an image mask layer (infrared-sensitive layer) in a developer is good in a developing step of a water-developable printing original plate suitable for a CTP technique and also to provide a water-based developer where the scum dispersibility in the developer is good even the developing is repeatedly conducted in large quantities using the same developer in a developing step of a water-developable printing original plate.

Means for Solving the Problem

The present inventors have extensively investigated the above-mentioned conventional problems and found that the above-mentioned aimed water-based developer for a printing plate can be obtained when a developer composition for a printing plate containing (a) alkali metal salt of saturated fatty acid having carbon number of 12 to 18 and (b) alkali metal salt of unsaturated fatty acid having carbon number of 12 to 18 in a specific ratio by weight is used whereupon the present invention has been achieved.

The present invention has the constitutions of the following (1) to (11):

(1) A developer composition for a printing plate containing (a) alkali metal salt of saturated fatty acid having carbon number of 12 to 18 and (b) alkali metal salt of unsaturated fatty acid having carbon number of 12 to 18 in a weight ratio of from 20:80 to 80:20 in terms of (a):(b).

(2) The developer composition according to (1), wherein the alkali metal salt in the above component (a) and/or component (b) is sodium salt and/or potassium salt.

(3) The developer composition according to (1) or (2), wherein the unsaturated fatty acid in the above component (b) is mono-unsaturated fatty acid and/or di-unsaturated fatty acid.

(4) The developer composition according to any of (1) to (3), wherein the above component (a) is sodium laurate and/or potassium laurate.

(5) The developer composition according to any of (1) to (4), wherein the above component (b) is sodium oleate and/or potassium oleate.

(6) A water-based developer for a printing plate containing 0.01 to 10% by weight of the developer composition mentioned in any of (1) to (5) and water.

(7) A method for manufacturing a printing plate comprising a step of developing, by the water-based developer mentioned in (6), a flexographic printing original plate where at least a support (A), a photosensitive resin layer (B), a protective layer (C) and an infrared-sensitive layer (D) are successively layered.

(8) The method for manufacturing a printing plate according to (7), wherein the infrared-sensitive layer (D) contains carbon black.

(9) The developer composition according to any of (1) to (5), wherein it further contains an alkali agent (c) and said (c) is 0.01 to 10 part(s) by weight to 100 parts by weight in total amount of (a) and (b).

(10) The developer composition according to (9), wherein the above component (c) is alkali metal carbonate and/or alkali metal hydroxide and wherein the alkali metal is sodium and/or potassium.

(11) A water-based developer for a printing plate containing 0.01 to 10% by weight of the developer composition mentioned in (9) or (10) and water.

(12) A method for manufacturing a printing plate comprising a step of developing, by the water-based developer mentioned in (11), a flexographic printing original plate where at least a support (A), a photosensitive resin layer (B), and an adhesion-preventing layer (E) are successively layered.

Advantages of the Invention

In the developer composition as well as a developer prepared therefrom according to the present invention, dispersibility of an image mask layer to the developer is good. Accordingly, there hardly happen the problems such as that small pieces of the image mask layer stick to a brush whereby the developing property lowers, that the scum sticks to the brush whereby the developing property lowers and that it sticks to the printing plate surface again whereby the quality of the plate surface is deteriorated. In addition, when such a developer is used, it is not necessary to frequently exchange the developer whereby that is also advantageous in terms of the load to environment and of the manufacturing cost.

BEST MODE FOR CARRYING OUT THE INVENTION

As hereunder, the developer composition for a printing plate, the developer and the methods for manufacturing a printing plate in accordance with the present invention will be illustrated in detail.

A developer composition for a printing plate of the present invention is characterized by containing (a) alkali metal salt of saturated fatty acid having carbon number of 12 to 18 and (b) alkali metal salt of unsaturated fatty acid having carbon number of 12 to 18 in a weight ratio of from 20:80 to 80:20 in terms of (a):(b). The ratio by weight in terms of (a):(b) is preferred to be from 25:75 to 75:25, more preferred to be from 30:70 to 70:30, and most preferred to be from 30:70 to 50:50.

The component (a) used in the composition of the present invention is an alkali metal salt of saturated fatty acid having carbon number of 12 to 18 and it is preferred to be sodium salt and/or potassium salt. To be more specific, sodium laurate, sodium myristate, sodium palmitate, sodium stearate, potassium laurate, potassium myristate, potassium palmitate, and potassium stearate are exemplified. Although they may be used either solely or as a mixture, the sole use of potassium laurate is preferred. When potassium laurate is used as the component (a), dispersibility of the image mask layer in the developer is particularly good.

The component (b) used in the composition of the present invention is an alkali metal salt of unsaturated fatty acid having carbon number of 12 to 18 and it is preferred to be sodium salt and/or potassium salt. It is more preferred to be a mono-unsaturated fatty acid and/or a di-unsaturated fatty aid. To be more specific, sodium palmitoleate, sodium oleate, sodium linoleate, sodium linolenate, sodium ricinoleate, sodium arachidonate, potassium palmitoleate, potassium oleate, potassium linoleate, potassium linolenate, potassium ricinoleate, and potassium arachidonate are exemplified. Although they may be used either solely or as a mixture, the sole use of sodium oleate is preferred. When sodium oleate is used as the component (b), dispersibility of the image mask layer in the developer is particularly good.

The composing ratio of the component (a) to the component (b) in the composition of the present invention can be quantified by means of a gas chromatographic mass spectrometry.

The composition of the present invention may further contain an alkali agent (c). The alkali agent (c) is preferred to be 0.01 to 10 part(s) by weight to 100 parts by weight in total of the components (a) and (b).

As to the component (c) used for the composition of the present invention, although the conventionally known alkali agent may be used, it is preferred to be alkali metal carbonate and/or alkali metal hydroxide and is more preferred that the alkali metal is sodium and/or potassium. To be more specific, sodium carbonate, potassium carbonate, sodium hydroxide and potassium hydroxide may be exemplified. Among them, sodium carbonate is preferred in view of safety.

Some of the commercially available soaps may contain the components (a), (b) and (c) of the composition of the present invention in the same ratio by weight. However, the commercially available soaps are in a complicated composition containing various adjuvants besides the components (a) and (b) which are surfactants and the component (c) which is the alkali agent. To be more specific, examples of the adjuvant include metal sequester, enzyme, antiseptic, fluorescent whitener, perfume, etc. and such a one is added for promoting the washing of the dirt adhered to the clothing and for enhancing the finish and the texture. Some of those adjuvants may inhibit the effect of the present invention and, particularly, enzyme, fluorescent whitener and perfume have a risk of inhibiting the effect of the present invention due to, for example, lowering the developing property and sticking onto the plate surface causing the deterioration of printing property. In addition, even in the case of the same trade name, composition of the commercially available soap may sometimes vary whereby the effect of the present invention may not be exhibited.

The component (a) can be manufactured, for example, by a method where a saturated fatty acid having carbon number of 12 to 18 is neutralized with an alkali agent such as sodium hydroxide or potassium hydroxide (a neutralizing method of fatty acid), a method where an ester of a saturated fatty acid having carbon number of 12 to 18 is saponified with an alkali agent such as sodium hydroxide or potassium hydroxide (a saponifying method of fatty acid ester) and a method where natural fat/oil containing saturated fatty acid having carbon number of 12 to 18 is saponified with an alkali agent such as sodium hydroxide or potassium hydroxide (a saponifying method of fat/oil).

The component (b) can be manufactured, for example, by a method where an unsaturated fatty acid having carbon number of 12 to 18 is neutralized with an alkali agent such as sodium hydroxide or potassium hydroxide (a neutralizing method of fatty acid), a method where an ester of an unsaturated fatty acid having carbon number of 12 to 18 is saponified with an alkali agent such as sodium hydroxide or potassium hydroxide (a saponifying method of fatty acid ester) and a method where natural fat/oil containing unsaturated fatty acid having carbon number of 12 to 18 is saponified with an alkali agent such as sodium hydroxide or potassium hydroxide (a saponifying method of fat/oil).

The developer composition of the present invention can be used as a water-based developer for printing plate by dissolving in water. The content of the developer composition to the total amount of the developer is made 0.01 to 10% by weight, preferred to be made 0.1 to 5% by weight, and more preferred to be made 0.5 to 3% by weight. When the content of the developer composition is more than 10% by weight, dispersibility of the image mask layer tends to be inferior while, when it is less than 0.01% by weight, ability for removing the non-crosslinked resin composition tends to be inferior.

The water which is used for preparing the water-based developer of the present invention may be tap water or pure water which is obtained by an ion exchange method, a distilling method, a reverse osmosis membrane method or a combination thereof. The water-based developer of the present invention can be prepared by a method where the components of the developer composition of the present invention and water are stirred to homogenize. There is no particular limitation for the order of compounding the components. Further, the water-based developer of the present invention is a weakly alkaline aqueous solution which is stable at a broad temperature range of 0 to 50° C. and is safe as compared with the strongly alkaline developer.

In the developer composition for printing plate and the water-based developer according to the present invention, various additives can be compounded as other optional components upon necessity. For example, a metal sequester such as citric acid or EDTA, an alkanolamine such as ethanolamine, a pH adjusting agent such as sodium carbonate, sodium hydroxide or potassium hydroxide, an antiseptic agent such as benzotriazole or benzoic acid, an agent for lowering the coagulating point such as glycol (e.g., ethylene glycol) or lower alcohol (e.g., ethanol) and a defoaming agent such as silicone or polyol may be appropriately compounded within an extent that the compounding as such does not deteriorate the effect of the present invention.

The water-based developer constituted as such is excellent in its stability with elapse of time and is particularly suitable as a developer for flexographic printing plate appropriate for CTP plate-making or negative plate-making technique.

As to a method for the developing treatment using the water-based developer of the present invention, an example is such a method where the developer is made to contact to the non-exposed area, physical action such as brush, water pressure or ultrasonic wave is applied so that the non-crosslinked area of the photosensitive resin layer and the image mask layer are dissolved or dispersed into the developer and developed/removed. In that case, the non-exposed area may be dipped in the developer or the developer may be continuously supplied and made to contact to the non-exposed area when physical action arises. In addition, it is preferred that the developer is warmed. In general, it is 20 to 60° C., and preferably 30 to 50° C. Further, a brush is used as the commonly used physical action force and material, thickness and length of bristles, densely planted degree and alignment of bristles, movement and rotating direction of brush, etc. can be appropriately selected.

Although the water-based developer of the present invention can be used for developing the water-developable general photosensitive printing original plate, it is particularly suitable for the development of CTP printing original plate containing carbon black in an infrared-sensitive layer and for the development of flexographic printing original plate of a negative system. That is because said developer is particularly excellent in its dispersing property of the infrared-sensitive layer containing carbon black and in its scum dispersing property in the water-based developer.

Now, as a specific example of the method of using the water-based developer of the present invention, its application to water-developable flexographic plate is exemplified and illustrated as follows.

In a CTP system, the water-developable flexographic printing original plate generally has such a constitution where a support (A), a photosensitive resin layer (B), a protective layer (C) and an infrared-sensitive layer (D) are successively layered. In a negative system, the water-developable flexographic printing original plate generally has such a constitution where a support (A), a photosensitive resin layer (B), and an adhesion-preventing layer (E) are successively layered.

The support (A) is preferably made from a material being flexible and having a superior dimension stability, and examples thereof include: a support made of metal, such as steel, aluminum, copper and nickel, and a support made of a thermoplastic resin, such as a polyethylene terephthalate film, a polyethylene naphthalate film, a polybutylene terephthalate film and a polycarbonate film. Among these, the polyethylene terephthalate film, which has a superior dimension stability and a sufficiently high viscoelasticity, is particularly preferable. The thickness of the support is set to 50 to 350 µm, preferably to 100 to 250 µm, from the viewpoints of mechanical properties, shape stability and handling characteristics upon producing a printing plate. Moreover, if necessary, in order to improve an adhesive property between the support and a photosensitive resin layer, an adhesive may be formed between them.

The photosensitive resin layer (B) is composed of essential components, such as a synthetic polymer compound, a photopolymerizable unsaturated compound and a photopolymerization initiator, and optional additives, such as a plasticizer, a thermal polymerization inhibitor, a dye, a pigment, an ultraviolet-ray absorbing agent, perfume, and an antioxidant. In the present invention, the photosensitive resin layer (B) must be the one which is developable by using a water-based developer. Latex is preferably used as the synthetic polymer compound that is developable by water. Although the photosensitive resin layer developable by water is usually flexible, the raw plate inevitably becomes very flexible when latex is used. When latex is not used, the thing which is mentioned, for example, in Japanese Laid-Open Patent No. 198058/91 may be used.

Examples of the latex to be used include: water-dispersible latex polymers, such as polybutadiene latex, natural rubber latex, styrene-butadiene copolymer latex, acrylonitrile-butadiene copolymer latex, polychloroprene latex, polyisoprene latex, polyurethane latex, methylmethacrylate-butadiene copolymer latex, vinylpyridine polymer latex, butyl polymer latex, thiokol polymer latex and acrylate polymer latex, and polymers obtained by copolymerizing another component, such as acrylic acid and methacrylic acid, therewith. Among these, water-dispersible latex polymers having a butadiene structure or an isoprene structure in molecular chains are preferably used from the viewpoints of hardness and rubber elasticity. More specifically, polybutadiene latex, styrene-butadiene copolymer latex, acrylonitrile-butadiene copolymer latex, methylmethacrylate-butadiene copolymer latex and polyisoprene latex are preferably used. The latex needs to be designed so that its existence is confirmed as independent fine particles.

The protective layer (C) is provided for preventing the polymerization inhibition of the photosensitive resin layer due to oxygen. The protective layer (C) is not particularly limited as far as it can be removed by a water-based developer and it may be constituted using any of water-soluble and water-insoluble polymers. Although even a water-insoluble polymer can be removed by physically rubbing with a brush and can be developed, a water-soluble polymer is preferred for a purpose of shortening the developing time. Examples of such a polymer constituting the protective layer (C) include soluble polyamide, polyvinyl alcohol, polyacrylic acid, polyethylene oxide, alkyl cellulose, cellulose-type polymer (particularly, hydroxypropyl cellulose, hydroxyethyl cellulose or nitrocellulose), cellulose acetate butyrate, polybutyral, butyl rubber, NBR rubber, acrylic rubber, styrene-butadiene rubber, latex and soluble polyester. With regard to those polymers, the use is not limited to only one kind of them but two or more kinds of the polymers may be combined and used as well. As to the protective layer (C), that which has higher thermal decomposition temperature than the infrared-sensitive layer is preferred. That is because, when the thermal decomposition temperature of the protective layer is lower than that of the infrared-sensitive layer, the protective layer may be also thermally decomposed during the ablation of the infrared-sensitive layer.

The infrared-sensitive layer (D) is composed of a binder and a material having a function for absorbing infrared laser rays to convert them into heat and a function for blocking ultraviolet rays. Moreover, optional components except for these, such as a pigment dispersant, a filler, a surfactant or a painting aid, may be contained therein within such a range as not to impair the effects of the present invention.

The infrared-sensitive layer (D) is preferably designed to have an optical density of 2.0 or more, more preferably, an optical density of 2.0 to 3.0, and most preferably, an optical density of 2.2 to 2.5, relative to chemical rays. Also, the layer thickness of the infrared-sensitive (D) is preferably set to 0.5 to 5.0 µm, more preferably, to 1.0 to 2.0 µm. When the layer thickness is set to the above-mentioned lower limit or more, it is possible to obtain an optical density of not less than a predetermined value, without the necessity of a high coating technique. Moreover, when the layer thickness is set to the above-mentioned upper limit or less, high energy is not required for evaporation of the infrared-sensitive layer, which is advantageous from the viewpoint of costs.

Although there is no particular limitation for the above binder, a copolymerized polyamide having polarity is preferably used. The polyamide used may be appropriately selected from the conventionally known cationic polyamide, nonionic polyamide and anionic polyamide and examples thereof include polyamide which contains tertiary amine group, polyamide which contains quaternary ammonium salt group, polyamide which contains ether group and polyamide which contains sulfonic group.

Examples of the above material having an infrared ray absorbing function and an ultraviolet ray blocking function include dyes such as phthalocyanine, substituted phthalocyanine derivative, cyanine, merocyanine dye or polymethine dye and pigments such as carbon black, graphite, chromium oxide or iron oxide. Among them, carbon black is particularly preferred in view of light-heat converting rate, economy and handling property.

The above material having an infrared ray absorbing function and an ultraviolet ray blocking function is used appropriately in such a concentration that can achieve the above optical density and layer thickness. Usually, it is 1 to 60% by weight or, preferably, 10 to 50% by weight to the total weight of the infrared-sensitive layer (D). When the amount is less than the lower limit, the optical density becomes less than 2.0 and there is a risk that neither infrared ray absorbing function nor ultraviolet ray blocking function is exhibited. When the amount is more than the above upper limit, other component such as a binder becomes insufficient and there is a risk that the coat-forming property lowers.

It is preferable to provide a peelable flexible cover film on the infrared-sensitive layer (D) to protect the printing original plate. Examples of the appropriate preferable peelable flexible cover film include a polyethylene terephthalate film, a polyethylene naphthalate film and a polybutylene terephthalate film.

An adhesion-preventing layer (E) is provided for preventing the adhesion of the photosensitive resin layer to the original picture film when the original picture film is tightly attached to the photosensitive resin printing plate in vacuo and active ray is irradiated passing through the original picture film. The adhesion-preventing layer (E) may be constituted using any of water-soluble and water-insoluble polymers. Although even a water-insoluble polymer can be removed by physically rubbing with a brush and can be developed, a water-soluble polymer is preferred for a purpose of shortening the developing time. Examples of such a polymer constituting the adhesion preventing layer (E) include soluble polyamide, polyvinyl alcohol, polyacrylic acid, polyethylene oxide, alkyl cellulose, cellulose-type polymer (particularly, hydroxypropyl cellulose, hydroxyethyl cellulose or nitrocellulose), cellulose acetate butyrate, polybutyral, butyl rubber, NBR rubber, acrylic rubber, styrene-butadiene rubber, latex and soluble polyester. With regard to those polymers, the use is not limited to only one kind of them but two or more kinds of the polymers may be combined and used as well. Besides the above, various kinds of additives may be compounded as optional components upon necessity.

It is preferred to provide a peelable flexible cover film on the adhesion preventing layer (E) to protect the printing original plate. Examples of the appropriate peelable flexible cover film include a polyethylene terephthalate film, a polyethylene naphthalate film and a polybutylene terephthalate film.

In a CTP system, the printing original plate of the present invention is, for example, manufactured by using the following processes.

First, all the components of the infrared-sensitive layer are dissolved in an appropriate solvent to prepare a solution, or all the components except for pigments are dissolved in an appropriate solvent when pigments like carbon black is used, and pigments are then dispersed therein to prepare a dispersion solution. Next, this solution or dispersion solution is applied to a support (for example, a PET film) for a infrared-sensitive layer, and the solvent is evaporated. Thereafter, protective layer components are applied thereon so that one of laminated bodies is formed. In the meantime, in a separated manner from this, a photosensitive resin layer is formed on a support by a coating process so that the other laminated body is prepared. The two laminated bodies, thus obtained, are laminated under pressure and/or a heating process so that the photosensitive resin layer is arranged adjacent to the protective layer. Here, the support for the infrared-sensitive layer functions as a surface protective film after completion of the printing original plate.

A method for manufacturing a printing plate from this printing original plate includes processes in which, first, the cover film is removed from the photosensitive printing original plate. Thereafter, the infrared-sensitive layer is imagewise-irradiated with an IR laser so that an image mask is formed on the photosensitive resin layer. Preferable examples of the IR laser include an ND/YAG laser (1064 nm) and a diode laser (for example, 830 nm). A laser system appropriate for the Computer to Plate Technique is commercially available, and, for example, a diode laser system CDI Spark (manufactured by Esko Artwork) may be used. This laser system includes a rotation cylinder drum used for holding a printing original plate, an IR laser irradiating device and a layout computer. Image information is directly transferred from the layout computer to the laser device.

After the image information has been written in the infrared-sensitive layer, active light rays are applied onto the entire surface of the photosensitive printing original plate via the image mask. This process may be carried out with the plate attached to the laser cylinder; however, a method is generally used in which, after the plate has been removed from the laser device, the irradiation process is carried out by using a commonly-used irradiation unit having a flat plate shape because this method is more advantageous in that even a plate size out of the standard can be appropriately handled. Examples of the active light rays include ultraviolet rays having a wavelength in a range from 150 to 500 nm, in particular, from 300 to 400 nm. Examples of its light source include a low-pressure mercury lamp, a high-pressure mercury lamp, a super-high pressure mercury lamp, a metal halide lamp, a xenon lamp, a zirconium lamp, a carbon arc lamp and an ultraviolet-ray fluorescent lamp. Thereafter, the irradiated plate is developed by using the developer of the present invention whereby a printing plate is obtained.

In a negative system, the printing original plate of the present invention is, for example, manufactured by using the following processes.

First, the component of the adhesion-preventing layer is dissolved in an appropriate solvent. This solution is applied to a support (for example, a PET film), and the solvent is evaporated so that one of laminated bodies is formed. In the meantime, in a separated manner from this, a photosensitive resin layer is formed on a support by a coating process so that the other laminated body is prepared. The two laminated bodies, thus obtained, are laminated under pressure and/or a heating process so that the photosensitive resin layer is arranged adjacent to the adhesion-preventing layer. Here, the support functions as a surface protective film after completion of the printing original plate.

A method for manufacturing a printing plate from this printing original plate includes processes in which, first, the cover film is removed from the photosensitive printing original plate. Thereafter, a negative film having the image is placed on top of the printing original plate, and active light rays are applied onto the entire surface thereof after vacuum extraction. Examples of the active light rays include ultraviolet rays having a wavelength in a range from 150 to 500 nm, in particular, from 300 to 400 nm. Examples of its light source include a low-pressure mercury lamp, a high-pressure mercury lamp, a super-high pressure mercury lamp, a metal halide lamp, a xenon lamp, a zirconium lamp, a carbon arc lamp and an ultraviolet-ray fluorescent lamp. Thereafter, the irradiated plate is developed by using the developer of the present invention whereby a printing plate is obtained.

EXAMPLES

The present invention will now be specifically illustrated by way of the following Examples although the present invention is not limited thereto.

Examples 1A to 14A, Comparative Examples 1A to 8A

A flexographic printing original plate of a CTP system was prepared by the following methods (1) to (5). A printing plate was prepared by the following method (6) using the resulting flexographic printing original plate. In addition, dispersibility of the image mask was evaluated by the following method (7). Developer compositions of Examples 1A to 14A and Comparative Examples 1A to 8A and evaluated results thereof are shown in Table 1 and Table 2.

(1) Preparation of Photosensitive Resin Composition X 10 parts by weight of Acrylonitrile-butadiene latex (Nipol SX1503 containing 42% of non-volatile components; manufactured by Nippon Zeon), 58 parts by weight of butadiene latex (Nipol LX111NF containing 55% of non-volatile components; manufactured by Nippon Zeon), 28 parts by weight of oligobutadiene acrylate (ABU-2S manufactured by Kyoeisha Kagaku), 4 parts by weight of lauryl methacrylate (Light Ester L manufactured by Kyoeisha Kagaku), 4 parts by weight of dimethylol tricyclodecane diacrylate, 1 part by weight of photopolymerization initiator, 0.1 part by weight of hydroquinone monomethyl ether (as a polymerization inhibitor) and 0.1 part by weight of nonionic surfactant (as other additive) were mixed in a container together with 15 parts by weight of toluene and kneaded at 105° C. using a pressurizing kneader and, after that, toluene and water were removed therefrom in vacuo to give a photosensitive resin composition X.

(2) Preparation of Applying Liquid for the Protective Layer

Polyvinyl alcohol of low saponification degree (PVA 405 manufactured by Kuraray), a plasticizer (Sanflex SE 270 manufactured by Sanyo Chemical Industries; polyether polyol of an aliphatic polyhydric alcohol type; solid concentration: 85%) and NBR latex (SX 1503A manufactured by Nippon Zeon; solid concentration: 42%) were dissolved in a mixture of water with isopropyl alcohol to make their ratio by weight 35/35/30 in terms of the solid whereupon an applying liquid for the protective layer was prepared.

(3) Preparation of Applying Liquid for the Infrared-Sensitive Layer

A carbon black dispersion (AMBK-8 manufactured by Orient Chemical Industries) and a copolymerized polyamide (PA 223 manufactured by Toyobo) were dissolved in a mixture of methanol, ethanol and isopropyl alcohol to make their ratio by weight 63/37 in terms of the solid whereupon an applying liquid for the infrared-sensitive layer was prepared.

(4) Preparation of Layered Film Y

The applying liquid for the infrared-sensitive layer was applied using a bar coater of a suitable type onto a PET film of 100 μm where both sides were previously subjected to a releasing treatment and was dried at 120° C. for 5 minutes whereby an infrared-sensitive layer of 1.5 μm film thickness was layered on a PET film. Its optical density at that time was 2.3. This optical density was measured by DM-520 (a black-and-white transmission densitometer manufactured by Dainippon Screen).

After that, the applying liquid for the protective layer was applied onto the above infrared-sensitive layer using a bar coater of a suitable type and dried at 120° C. for 5 minutes to prepare a layered film Y where the infrared-sensitive layer of 1.5 μm film thickness and the protective layer of 0.5 μm film thickness were layered on the PET film in this order.

(5) Preparation of Flexographic Printing Original Plate with Photosensitive Resin Composition X The above photosensitive resin composition X was aligned on the PET film of 100 μm to which the adhesive of a copolymerized polyester type was applied and a layered film Y was laid thereon. Lamination was conducted at 100° C. using a heat press machine to give a flexographic printing original plate comprising a PET support, an adhesive layer, a photosensitive resin layer, a protective layer, an infrared-sensitive layer and a PET protective film subjected to a releasing treatment (cover film).

(6) Preparation of Printing Plate Using a Flexographic Printing Original Plate and Evaluation of the Developing Property Chemical ray (light source: Philips 10R; illuminance at 365 nm: 8 mW/cm$^2$) was irradiated for 1 minute from the side of the PET support of the original plate. After that, the PET film being subjected to a releasing treatment (cover film) was peeled. This plate was wound around a rotating drum of CDI Spark 2530 (manufactured by Esko Artwork) in such a manner that the infrared-sensitive layer comes to the surface side followed by vacuum extraction and then image formation was conducted. After the ablation, the plate was taken out, returned to plane and irradiated with chemical ray (light source: Philips 10R; illuminance at 365 nm: 8 mW/cn$^2$) for 6 minutes.

After the exposure to light, each of the developer compositions of Examples 1A to 7A and Comparative Examples 1A to 4A shown in the following Table 1 and the developer compositions of Examples 8A to 14A and Comparative Examples 5A to 8A shown in the following Table 2 was diluted with tap water to an extent of 1% by weight to prepare a developer and then developing was conducted at 40° C. for 8 minutes using a developing device (Stuck System) manufactured by A&V. After the developing, drying was conducted at 60° C. for 10 minutes, chemical ray was irradiated thereto for 10 minutes and, finally, irradiation of a germicidal lamp was conducted for 5 minutes to remove the surficial adhesive property.

A good printing plate could be prepared without problem by the use of any of the water-based developers. No deterioration of the quality of the surface of the printing plate due to adhesion of the scum was noted.

(7) Evaluation of Image Mask Dispersibility

Each of the developer compositions of Examples 1A to 7A and Comparative Examples 1A to 4A shown in the following Table 1 and each of the developer compositions of Examples 8A to 14A and Comparative Examples 5A to 8A shown in the following Table 2 was diluted with tap water to an extent of 1% by weight to prepare 100 ml of a developer. Into each developer, each one sheet of 25 sheets of original plate of 7 cm×7 cm was dipped with oscillation for 30 seconds and the image mask layer was detached from the original plate. Size of the dispersed image mask layer was evaluated by naked eye. Size of 10 small pieces was measured using a ruler and their mean value was calculated. The cases where the size of the small piece was less than 1 mm, 1 mm to less than 3 mm, 3 mm to less than 5 mm or not less than 5 mm were marked "oooo", "oo", "o" (medium size) and "x" (big size), respectively.

TABLE 1

|  |  |  |  | example |  |  |  |  |  |  | comparative example |  |  |  |
|---|---|---|---|---|---|---|---|---|---|---|---|---|---|---|
|  |  |  |  | 1A | 2A | 3A | 4A | 5A | 6A | 7A | 1A | 2A | 3A | 4A |
| developer composition (parts by weight) | Na salt of saturated fatty acid | C10 | capric acid |  |  |  |  |  |  |  |  | 33 |  |  |
|  |  | C12 | lauric acid | 25 | 33 |  |  |  | 75 | 15 |  |  |  | 100 |
|  |  | C14 | myristic acid |  |  | 33 |  |  |  | 5 |  |  |  |  |
|  |  | C16 | palmitic acid |  |  |  | 33 |  |  | 7 |  |  |  |  |
|  |  | C18 | stearic acid |  |  |  |  | 33 |  | 6 |  |  |  |  |
|  |  | C20 | arachidic acid |  |  |  |  |  |  |  |  |  | 33 |  |

TABLE 1-continued

| | | | | example | | | | | | | comparative example | | | |
|---|---|---|---|---|---|---|---|---|---|---|---|---|---|---|
| | | | | 1A | 2A | 3A | 4A | 5A | 6A | 7A | 1A | 2A | 3A | 4A |
| | Na salt of unsaturated fatty acid | C18:1 | oleic acid | 75 | 67 | 67 | 67 | 67 | 25 | 61 | 100 | 67 | 67 | |
| | | C18:2 | linoleic acid | | | | | | | 6 | | | | |
| evaluation | | | developing property | o | o | o | o | o | o | o | o | o | o | o |
| | | | image mask dispersibility | o | oooo | oooo | oo | oo | o | oooo | x | x | x | x |

In the Table, the developer composition (parts by weight) shows parts by weight of all components.

TABLE 2

| | | | | example | | | | | | | comparative example | | | |
|---|---|---|---|---|---|---|---|---|---|---|---|---|---|---|
| | | | | 8A | 9A | 10A | 11A | 12A | 13A | 14A | 5A | 6A | 7A | 8A |
| developer composition (parts by weight) | K salt of saturated fatty acid | C10 | capric acid | | | | | | | | | 33 | | |
| | | C12 | lauric acid | 25 | 33 | | | | 75 | 15 | | | | 100 |
| | | C14 | myristic acid | | | 33 | | | | 5 | | | | |
| | | C16 | palmitic acid | | | | 33 | | | 7 | | | | |
| | | C18 | stearic acid | | | | | 33 | | 6 | | | | |
| | | C20 | arachidic acid | | | | | | | | | | 33 | |
| | K salt of unsaturated fatty acid | C18:1 | oleic acid | 75 | 67 | 67 | 67 | 67 | 25 | 61 | 100 | 67 | 67 | |
| | | C18:2 | linoleic acid | | | | | | | 6 | | | | |
| evaluation | | | developing property | o | o | o | o | o | o | o | o | o | o | o |
| | | | image mask dispersibility | o | oooo | oooo | oo | oo | o | oooo | x | x | x | x |

In the Table, the developer composition (parts by weight) shows parts by weight of all components.

Examples 1B to 12B, Comparative Examples 1B to 4B

Cosmolite NS170F (manufactured by Toyobo) was used as a flexographic printing original plate of a negative system. A developer was prepared by the following method (1) and its developing property (pH and scum dispersibility) was evaluated by the following method (2). Developer compositions of Examples 1B to 12B and Comparative Examples 1B to 4B and evaluated results thereof are shown in Table 3 and Table 4.

(1) Preparation of Developer

Each of the developer compositions of Examples 1B to 12B and Comparative Examples 1B to 4B shown in the following Table 3 and Table 4 was diluted with tap water to an extent of 1% by weight to prepare a developer. A developer (45 kg) was poured into a developing device (Stuck System) manufactured by A&V and the temperature was raised up to 40° C.

(2) Evaluation of Developing Property

An original plate of 381 mm×305 mm (0.116 m$^2$) was irradiated with chemical ray (light source: Philips 10R; illuminance at 365 nm: 8 mW/cm$^2$) for 15 seconds from the side of the support. After that, a protective film was peeled and developed for 7 minutes. A printing plate where the non-image area was 100% and the depth was 700 μm was prepared. Amount of the resin washed out by the developing was 0.08 kg per one sheet of the original plate. Whenever 28 sheets of the original plate were developed, 100 mL of a developer was sampled to a beaker and its pH was measured using a pH meter of handy type (SK-620PH manufactured by Sato Keiryoki Seisakusho). After that, a brush was lifted up and the degree of clogging by the scum was confirmed by naked eye. The cases where clogging by the scum was not noted and was noted in the brush were marked "o" and "x", respectively. When the brush was not clogged, a good printing plate could be prepared without problem. No deterioration of the quality on the printing plate surface by adhesion of the scum was noted. On the other hand, when the brush was clogged, deterioration of the quality on the printing plate surface by adhesion of the scum was noted. The stage when the brush clogging was noted was regarded as the limit of the use of the developer and the experiment was finished.

When a developer prepared from each of the developer compositions of Examples 1B to 12B was used, no deterioration of the quality on the printing plate surface by adhesion of the scum was noted even if the ratio by weight of the developed non-crosslinked resin to 100 parts by weight of the developer rose to 10 parts by weight or more. On the other hand, when a developer prepared from each of the developer compositions of Comparative Examples 1B to 4B was used, much clogging was noted in a brush if the ratio by weight of the non-crosslinked resin was more than 5 parts by weight whereby the deterioration of the quality of the printing plate surface by adhesion of the scum was significant.

TABLE 3

| | | | | example | | | | | | comparative example | |
|---|---|---|---|---|---|---|---|---|---|---|---|
| | | | | 1B | 2B | 3B | 4B | 5B | 6B | 1B | 2B |
| developer composition (parts by weight) | Na salt of saturated fatty acid | C10 | capric acid | | | | | 33 | 33 | 15 | 33 | |
| | | C12 | lauric acid | | | | | | | | |
| | | C14 | myristic acid | | | 33 | | | 5 | | |
| | | C16 | palmitic acid | | 33 | | | | 7 | | |
| | | C18 | stearic acid | 33 | | | | | 6 | | |
| | | C20 | arachidic acid | | | | | | | | 33 |
| | Na salt of unsaturated fatty acid | C18:1 | oleic acid | | 67 | 67 | 67 | 67 | 67 | 67 | 67 |
| | | C18:2 | linoleic acid | 67 | | | | | | | |
| | alkali agent | $Na_2CO_3$ | sodium carbonate | 0.01 | 0.1 | 1 | 10 | | | | |
| | | KOH | potassium hydroxide | | | | | 5 | 5 | | |
| evaluation of developing property | | number of sheets developed | ratio by weight of the non-crosslinked resin* | | | | developer pH/scum dispersibility | | | | | |
| | | 0 | 0 | 10.5 o | 10.5 o | 11.2 o | 11.3 o | 11.3 o | 11.2 o | 10.5 o | 10.5 o |
| | | 28 | 5 | 10.0 o | 10.0 o | 10.7 o | 10.8 o | 10.8 o | 10.7 o | 9.0 x | 9.0 x |
| | | 56 | 10 | 9.5 o | 9.7 o | 10.3 o | 10.4 o | 10.4 o | 10.3 o | | |
| | | 84 | 15 | 9.1 o | 9.5 o | 10.2 o | 10.2 o | 10.2 o | 10.2 o | | |
| | | 112 | 20 | 9.0 x | 9.2 o | 10.0 o | 10.0 o | 10.0 o | 10.0 o | | |
| | | 140 | 25 | | 9.1 o | 9.5 o | 9.5 o | 9.5 o | 9.5 o | | |
| | | 168 | 30 | | 9.0 x | 9.2 o | 9.2 o | 9.2 o | 9.2 o | | |
| | | 196 | 35 | | | 9.0 x | 9.1 o | 9.1 o | 9.1 o | | |
| | | 224 | 40 | | | | 9.0 x | 9.0 x | 9.0 x | | |

*ratio by weight of the non-crosslinked resin: ratio by weight of the non-crosslinked resin to 100 parts by weight of the developer
In the Table, the developer composition (parts by weight) shows parts by weight of all components.

TABLE 4

| | | | | example | | | | | | comparative example | |
|---|---|---|---|---|---|---|---|---|---|---|---|
| | | | | 7B | 8B | 9B | 10B | 11B | 12B | 3B | 4B |
| developer composition (parts by weight) | Na salt of saturated fatty acid | C10 | capric acid | | | | | 33 | 33 | 15 | 33 | |
| | | C12 | lauric acid | | | | | | | | |
| | | C14 | myristic acid | | | 33 | | | 5 | | |
| | | C16 | palmitic acid | | 33 | | | | 7 | | |
| | | C18 | stearic acid | 33 | | | | | 6 | | |
| | | C20 | arachidic acid | | | | | | | | 33 |
| | Na salt of unsaturated fatty acid | C18:1 | oleic acid | | 67 | 67 | 67 | 67 | 67 | 67 | 67 |
| | | C18:2 | linoleic acid | 67 | | | | | | | |
| | alkali agent | $Na_2CO_3$ | sodium carbonate | 0.01 | 0.1 | 1 | 10 | | | | |
| | | KOH | potassium hydroxide | | | | | 5 | 5 | | |
| evaluation of developing property | | number of sheets developed | ratio by weight of the non-crosslinked resin* | | | | developer pH/scum dispersibility | | | | | |
| | | 0 | 0 | 10.5 o | 10.5 o | 11.2 o | 11.3 o | 11.3 o | 11.2 o | 10.5 o | 10.5 o |
| | | 28 | 5 | 10.0 o | 10.0 o | 10.7 o | 10.8 o | 10.8 o | 10.7 o | 9.0 x | 9.0 x |
| | | 56 | 10 | 9.5 o | 9.7 o | 10.3 o | 10.4 o | 10.4 o | 10.3 o | | |
| | | 84 | 15 | 9.1 o | 9.5 o | 10.2 o | 10.2 o | 10.2 o | 10.2 o | | |
| | | 112 | 20 | 9.0 x | 9.2 o | 10.0 o | 10.0 o | 10.0 o | 10.0 o | | |
| | | 140 | 25 | | 9.1 o | 9.5 o | 9.5 o | 9.5 o | 9.5 o | | |
| | | 168 | 30 | | 9.0 x | 9.2 o | 9.2 o | 9.2 o | 9.2 o | | |
| | | 196 | 35 | | | 9.0 x | 9.1 o | 9.1 o | 9.1 o | | |
| | | 224 | 40 | | | | 9.0 x | 9.0 x | 9.0 x | | |

*ratio by weight of the non-crosslinked resin: ratio by weight of the non-crosslinked resin to 100 parts by weight of the developer
In the Table, the developer composition (parts by weight) shows parts by weight of all components.

INDUSTRIAL APPLICABILITY

The developer composition of the present invention and the developer prepared using the same can be advantageously used for developing a printing original plate and are particularly useful for developing a printing original plate of a CTP system having an infrared-sensitive layer containing carbon black or for developing a flexographic printing original plate of a negative system.

The invention claimed is:

1. A developer composition for a printing plate containing:
   (a) alkali metal salt of saturated fatty acid having carbon number of 12 to 16,
   (b) alkali metal salt of unsaturated fatty acid having carbon number of 12 to 18 in a weight ratio of from 20:80 to 80:20 in terms of (a):(b), and
   an alkali agent (c) and said (c) is 0.01 to 10 parts by weight to 100 parts by weight in total amount of (a) and (b), and the alkali metal salt of saturated fatty acid (a) and the alkali metal salt of unsaturated fatty acid (b) are 90.91 to 99.99 parts by weight of a total weight of the developer composition.

2. The developer composition according to claim 1, wherein the alkali metal salt in the above component (a) and/or component (b) is sodium salt and/or potassium salt.

3. The developer composition according to claim 1, wherein the unsaturated fatty acid in the above component (b) is mono-unsaturated fatty acid and/or di-unsaturated fatty acid.

4. The developer composition according to claim 1, wherein the above component (a) is sodium laurate and/or potassium laurate.

5. The developer composition according to claim 1, wherein the above component (b) is sodium oleate and/or potassium oleate.

6. The developer composition according to claim 1, wherein the above component (c) is alkali metal carbonate and/or alkali metal hydroxide and wherein the alkali metal is sodium and/or potassium.

7. A water-based developer for a printing plate containing 0.01 to 10% by weight of the developer composition mentioned in claim 1 and water.

8. A method for manufacturing a printing plate comprising a step of developing, by the water-based developer mentioned in claim 7, a flexographic printing original plate where at least a support (A), a photosensitive resin layer (B), and an adhesion-preventing layer (E) are successively layered.

9. The developer composition according to claim 1, wherein carbon number of the above component (b) is 18.

* * * * *